United States Patent
Liu et al.

(10) Patent No.: US 6,399,461 B1
(45) Date of Patent: Jun. 4, 2002

(54) ADDITION OF PLANARIZING DIELECTRIC LAYER TO REDUCE A DISHING PHENOMENA EXPERIENCED DURING A CHEMICAL MECHANICAL PROCEDURE USED IN THE FORMATION OF SHALLOW TRENCH ISOLATION REGIONS

(75) Inventors: Pao-Kuo Liu, Taipei; Ja-Rong Hsieh, Chiayi; Zhi-Yong Wang, Taipei, all of (TW)

(73) Assignee: Promos Technologies, Inc., Hsin-Chu (TW)

( * ) Notice: Subject to any disclaimer, the term of this patent is extended or adjusted under 35 U.S.C. 154(b) by 0 days.

(21) Appl. No.: 09/759,905

(22) Filed: Jan. 16, 2001

(51) Int. Cl.$^7$ ............................................. H01L 21/76
(52) U.S. Cl. ................... 438/436; 438/427; 438/435; 257/510
(58) Field of Search ........................... 438/424, 427, 438/435, 436; 257/510

(56) References Cited

U.S. PATENT DOCUMENTS

| | | | |
|---|---|---|---|
| 4,352,724 A | * 10/1982 | Sugishima et al. | 204/192 E |
| 4,836,887 A | * 6/1989 | Daubenspeck et al. | 156/643 |
| 5,312,512 A | 5/1994 | Allman et al. | 156/636 |
| 5,728,621 A | 3/1998 | Zheng et al. | 438/427 |
| 5,801,082 A | 9/1998 | Tseng | 438/424 |
| 5,817,567 A | * 10/1998 | Jang et al. | 438/427 |
| 5,872,043 A | * 2/1999 | Chen | 438/424 |
| 5,976,948 A | * 11/1999 | Werner et al. | 438/424 |
| 5,994,200 A | 11/1999 | Kim | 438/425 |
| 6,010,948 A | 1/2000 | Yu et al. | 438/436 |

OTHER PUBLICATIONS

Sorab Ghandi VSLI Fabrication Principles Wiley and Sons 1994 P.649.*
Stanley Wolf Silico Processing for the VSLI Era vol. 2 Lattice press 1990 pp. 195–198, 222–224, 232–235.*

* cited by examiner

Primary Examiner—Olik Chaudhuri
Assistant Examiner—David S Blum
(74) Attorney, Agent, or Firm—George O. Saile; Stephen B. Ackerman

(57) ABSTRACT

A process for fabricating silicon oxide filled, shallow trench isolation (STI), regions, in a semiconductor substrate, featuring the use of a disposable boro-phosphosilicate glass (BPSG), layer, used for planarization of various width, silicon oxide filled, STI regions, has been developed. After completely filling all STI shapes with a high density plasma (HDP), silicon oxide layer, resulting in a non-planar, HDP silicon oxide top surface topography, a BPSG layer is deposited. An anneal procedure is then performed resulting in a planar top surface topography of the reflowed BPSG layer. A chemical mechanical polishing procedure is next employed to remove the planar, reflowed BPSG layer, and portions of the underlying HDP silicon oxide, from the top surface of a silicon nitride stop layer, resulting in a planar top surface topography for all silicon oxide filled, insulator regions.

25 Claims, 3 Drawing Sheets

ADDITION OF PLANARIZING DIELECTRIC LAYER TO REDUCE A DISHING PHENOMENA EXPERIENCED DURING A CHEMICAL MECHANICAL PROCEDURE USED IN THE FORMATION OF SHALLOW TRENCH ISOLATION REGIONS

BACKGROUND OF THE INVENTION (1) Field of the Invention

The present invention relates to methods used to fabricate semiconductor devices, and more specifically to a method used to form shallow trench isolation (STI), regions, for semiconductor devices.

(2) Description of Prior Art

The objective of increasing semiconductor device performance has resulted in the use of shallow trench isolation (STI), regions, replacing field oxide (FOX), regions, for device isolation purposes. Unwanted lateral oxidation, or "birds beak" formation, occurring during the high temperature oxidation procedures used for FOX processing, necessitates the use of larger device dimensions to accommodate the unwanted birds beak or lateral oxide growth, resulting in semiconductor devices with larger then desired device regions. This in turn results in increases in parasitic junction capacitance, deleteriously influencing the performance of semiconductor devices fabricated with FOX isolation regions. The use of STI regions, formed by defining a trench shape in a specific region of the semiconductor substrate, followed by filling of the anisotropically formed shallow trench shape, avoids birds beak formation encountered with isolation regions obtained via FOX processing. Thus STI processing allows smaller devices to be realized, offering less junction capacitance and thus increased device performance when compared to counterparts fabricated using FOX technology.

The use of STI processing however has to be optimized to avoid specific structural problems that can degrade device yield and reliability. The insulator filled STI regions can be comprised of narrow width STI shapes, as well as larger width STI shapes. When filling these various shaped STI regions with chemically vapor deposited (CVD), insulator layers, the topography created by the CVD insulator layer located between densely packed, STI shapes, is higher than the topography created by the same CVD insulator layer located either in a wide STI shape, or from the CVD insulator located in large spaces between STI shapes. A chemical mechanical polishing (CMP), procedure, used to remove unwanted CVD material from regions other than the CVD layer in the STI shapes, can unfortunately "dish" or remove CVD layer fill from inside the lower topography regions, such as wide width STI shapes, or from large areas located between STI shapes. In addition to the lack of planarity resulting from the dishing phenomena, the CMP procedure applied to this type of topography can roughen the top surface of the CVD layer filling the STI shapes, again adversely influencing the objective of creating a smooth topography needed for subsequent overlying insulator and conductor structures.

This invention will teach a process of forming insulator filled, STI regions, using a CMP procedure for planarization via removal of unwanted insulator, however avoiding the unwanted "dishing" phenomena, and without the unwanted roughening of the surface of the insulator layer located in the STI regions. Prior art, such as Yu et al, in U.S. Pat. No. 6,010,948, describe a process of filling STI regions with a boro-phosphosilicate glass (BPSG), layer, resulting in a smooth topography of insulator in all dimensioned STI regions as a result of reflowing of the BPSG layer. The present invention however will describe a procedure in which reflowed BPSG is used only as a disposable layer, allowing a smooth topography of silicon oxide, in the STI shapes, to be realized via a CMP procedure removing the entire planarizing BPSG layer, and a portion of the underlying silicon oxide layer, resulting in a smooth top surface topography for silicon oxide filled, STI regions.

SUMMARY IF THE INVENTION

It is an object of this invention to form insulator filled, STI regions, in a semiconductor substrate.

It is another object of this invention to form the STI shapes via anisotropic, reactive ion etching (RIE), procedures, then fill the STI shapes with an underlying silicon oxide layer, and with an overlying BPSG layer.

It is yet another object of this invention to fill the STI shapes with an underlying silicon oxide layer, and an overlying spin on glass (SOG), layer.

It is still another object of this invention to perform an anneal procedure to reflow the blanket BPSG layer, creating a smooth top surface topography for the BPSG layer, overlying the silicon oxide filled STI regions.

It is still yet another object of this invention to perform a CMP procedure to completely remove the reflowed BPSG layer, and a portion of the underlying silicon oxide layer, resulting in a smooth top surface topography for the silicon oxide filled, STI regions.

In accordance with the present invention a method of forming insulator filled STI regions, for a semiconductor device, featuring a disposable, reflowed BPSG layer, used to allow a smooth top surface topography of the insulator filled STI regions, to be formed via a CMP procedure, is described. After growth or deposition of an underlying silicon oxide layer, and deposition of an overlying silicon nitride layer, on a semiconductor, photolithographic and anisotropic RIE procedures are employed to define openings in the silicon nitride and silicon oxide layer, and to form the STI shapes in the semiconductor substrate. A thermally grown silicon dioxide layer is then formed, lining the exposed surfaces of the STI shapes, followed by the deposition of a high density plasma, (HDP), deposition of silicon oxide, completely filling the STI shapes, as well as overlying the top surface of the silicon nitride layer, located between STI shapes. A BPSG layer is next deposited on the top surface of the HDP silicon oxide layer, filling the spaces created by the underlying silicon oxide layer in the STI shapes, and the silicon oxide layer located on the silicon nitride layer. An anneal procedure is then used to reflow the BPSG layer resulting in a BPSG layer exhibiting a smooth top surface topography. A CMP procedure is next used to completely remove the reflowed BPSG layer, and a portion of the underlying HDP silicon oxide layer, with the CMP procedure terminating at the top surface of the silicon nitride layer, resulting in silicon oxide filled, STI regions. After removal of the silicon nitride layer, and of the silicon oxide layer, semiconductor devices are formed on regions of the semiconductor substrate located between the silicon oxide filled, STI regions.

A second embodiment of this invention is the use of a SOG layer, replacing the BPSG layer, for planarization purposes, while a third embodiment entails removal of reflowed BPSG and a portion of the underlying HDP silicon oxide layer, from regions prone to the "dishing" phenomena, prior to the CMP procedure, via photolithographic and dry etching procedures.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
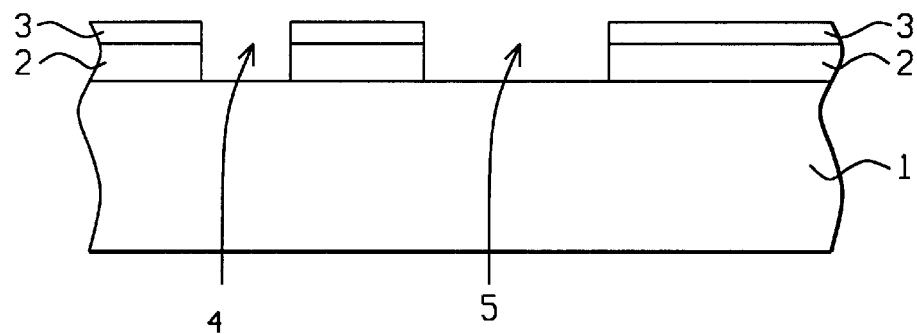
FIGS. 1–6, which schematically, in cross-sectional style, show key stages of fabrication used to form insulator filled STI regions, featuring a disposable, reflowed BPSG layer, used to allow a smooth top surface topography of the insulator filled STI regions, to be formed via a CMP procedure.

The method of forming insulator filled STI regions, featuring a disposable, reflowed BPSG layer, used to allow a smooth top surface topography for the insulator filled STI regions to be formed via a CMP procedure, will now be described in detail. A semiconductor substrate 1, comprised with single crystalline silicon, with a <100> crystallographic orientation, is used and schematically shown in FIG. 1. Silicon oxide layer 2, is next formed to a thickness between about 43 to 53 Angstroms, via low pressure chemical vapor deposition (LPCVD), plasma enhanced chemical vapor deposition (PECVD), or via a thermal oxidation procedure. An overlying silicon nitride layer 3, to be used as a stop layer for a subsequent chemical mechanical polishing (CMP), procedure, is next deposited via LPCVD or PECVD procedures, to a thickness between about 2050 to 2350 Angstroms. A photoresist shape, not shown in the drawings, is next used as an etch mask allowing an anisotropic RIE procedure to create narrow width, shallow trench shape 4, and wide width, shallow trench shape 5. The anisotropic RIE procedure is performed using $CF_4$ or $CHF_3$ as an etchant for silicon nitride layer 3, and for silicon oxide layer 2, while $Cl_2$ or $SF_6$ is used to from the shallow trench shapes in semiconductor substrate 1. The depth of the shallow trench shapes in semiconductor substrate 1, is between about 2000 to 3000 Angstroms, while the width of shallow trench shape 4, is between about 0.245 to 1.3 um, and greater than 1.3 um for shallow trench shape 5. The photoresist shape, used as a mask for definition of the shallow trench shapes, is removed via plasma oxygen ashing and careful wet cleans. The result of these procedures is schematically shown in FIG. 1.

Figure 2:
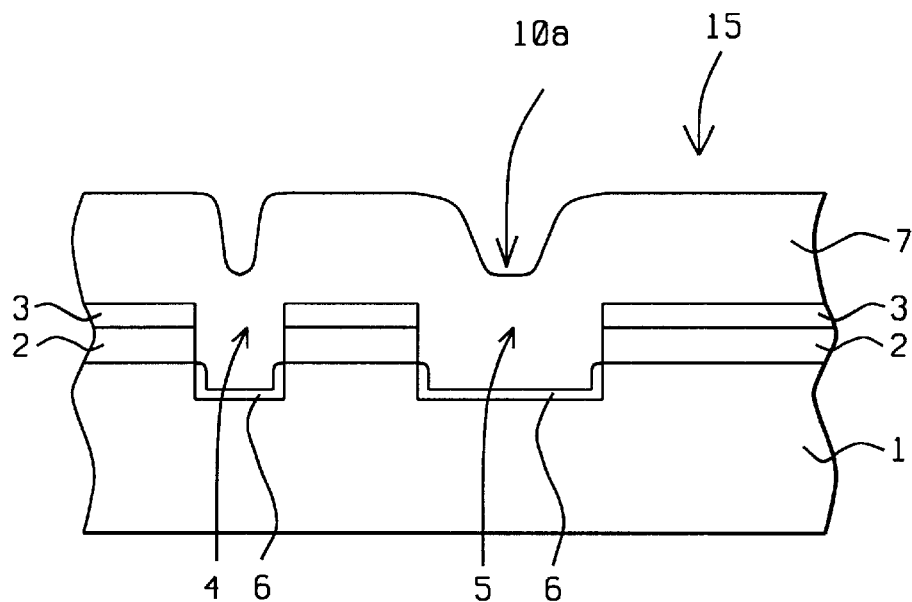
Figure 3:
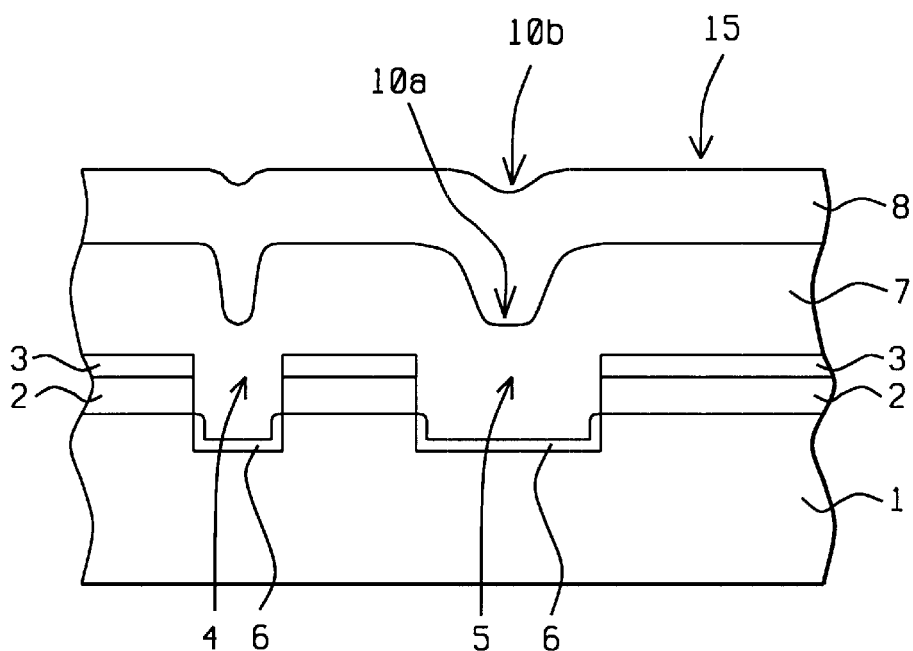

A silicon dioxide layer 6, is next formed via thermal oxidation procedures, at a thickness between about 50 to 250 Angstroms, to be used as a trench liner, allowing the regions of the semiconductor substrate to interface a thermally oxidized, silicon oxide layer, rather then a CVD insulator subsequently deposited to fill the shallow trench shapes. The use of silicon dioxide trench liner 6, is optional. Insulator layer 7, comprised of silicon oxide, is next used to completely fill the shallow trench shapes. Insulator layer 7, is obtained via a high density plasma (HDP), silicon oxide layer, deposited to a thickness between about 4500 to 5100 Angstroms, at a temperature between about 550 to 650° C., using tetraethylorthosilicate (TEOS), as a source. This is schematically shown in FIG. 2. Although HDP silicon oxide layer 7, completely fills both narrow and wide width trenches, the difference in height between the HDP silicon oxide layer in the trenches, and the HDP silicon oxide layer on the top surface of silicon nitride layer 3, creates depressions 10a, shown schematically in FIG. 2, which can result in problems for subsequent CMP procedures. In addition, not shown in the drawings is the difference in topography between the HDP silicon oxide layer, on silicon nitride layer 3, located in large spaces between trenches, and the HDP silicon oxide layer 7, located in the trenches. Depressions 10a, in HDP silicon oxide layer 7, located in wide trench 5, can dish, or have a larger then desired amount of insulator layer removed during a subsequent planarizing CMP procedure. In addition the portion of HDP silicon oxide layer 7, located in region 15, a region in which a large space between STI shapes exists, is also prone to the dishing phenomena during the planarizing CMP procedure. Therefore a procedure to planarize the surface of the device, prior to the CMP procedure, is used. A boro-phosphosilicate glass (BPSG), layer 8, is deposited via PECVD procedures to a thickness between about 5000 to 6000 Angstroms. BPSG, deposited using TEOS as a source for the silicon oxide component, is also comprised of $B_2O_3$ at a weight percent between about 3 to 4.5%, and comprised of $P_2O_5$ at a weight percent between about 3 to 5.5%. This composition allows an anneal procedure, performed at a temperature between about 850 to 950° C., for a time between about 30 to 90 min, to soften or reflow BPSG layer 8, resulting in the smooth top surface topography, shown schematically in FIG. 3. Depression 10a, in HDP silicon oxide layer 7, in wide trench 5, is reduced to a depression 10b, in reflowed, BPSG layer 8.

Figure 4:
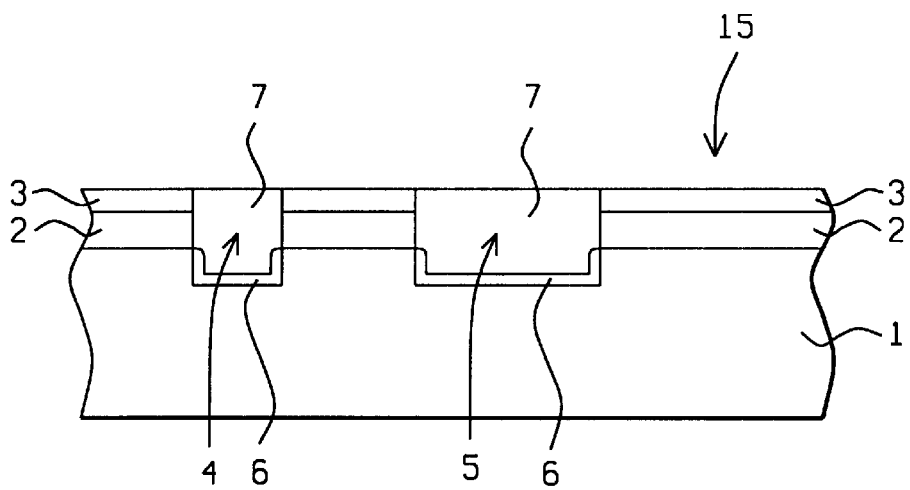

The result of the reduction in depressions in HDP silicon oxide layer 7, in wide trenches, or in regions in which HDP silicon oxide layer resided on the top surface of silicon nitride layer 3, in an area in which a large space between trenches exists, allows a subsequent CMP procedure to be performed, without dishing, or without removal of larger than desired portions of HDP silicon oxide layer 7. The CMP procedure selectively removes both reflowed, BPSG layer 8, as well as the portions of HDP silicon oxide layer 7, residing on the top surface of silicon nitride, polishing stop layer 3. This is schematically shown in FIG. 4. The CMP procedure, terminating at the appearance of silicon nitride layer 3, results in the desired smooth top surface topography, comprised of insulator filled trenches featuring a top surface level with the top surface of silicon nitride layer 3, in regions of densely packed trenches, as well as in regions of non-densely packed trenches, such as region 15. This is accomplished as a result of the CMP removal rate of both BPSG layer 8, and HDP silicon oxide layer 7, being equal, in addition to a uniform thickness of the composite insulator, (BPSG layer 8—HDP silicon oxide 7), across the entire device, resulting from the reflowed BPSG layer.

If desired, a second embodiment of this invention, featuring a spin-on glass (SOG), layer, can be used in place of BPSG layer 8. The SOG layer would be applied at a thickness between about 5000 to 7000 Angstroms, followed by the same anneal procedure previously used for the BPSG embodiment. The SOG deposition and a following anneal procedure, again results in reduction depressions in the underlying HDP silicon oxide layer, in regions in which the HDP silicon oxide layer resided in a wide trench. The fast removal rate of both SOG and HDP silicon oxide, during a CMP procedure, compared to lack of removal of silicon nitride stop layer 3, again allows the desired top surface topography, comprised of insulator filled trenches, planar with the top surface of silicon nitride layer 3, to be realized.

Figure 5:
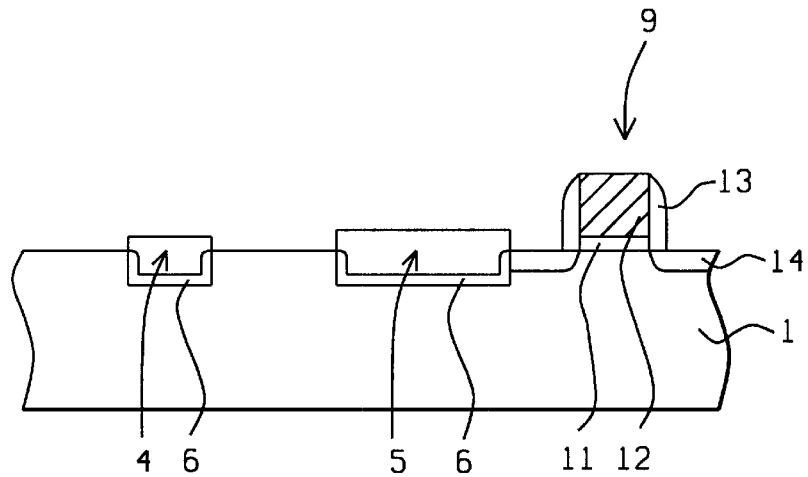
Figure 6:
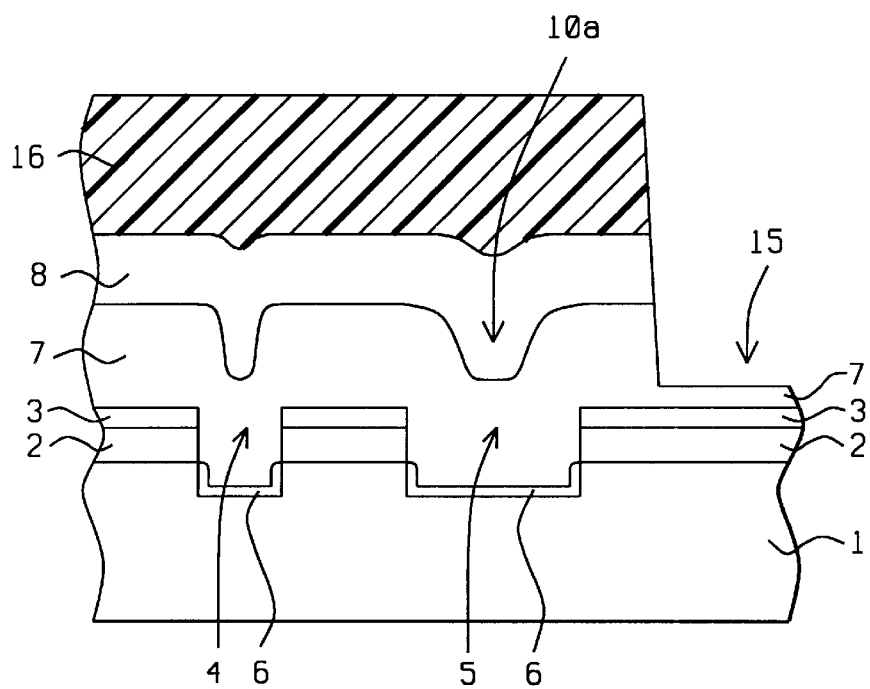

FIG. 5, schematically shows the formation of a device, such as a metal oxide semiconductor field effect transistor (MOSFET), device 9, featuring the HDP filled STI regions for isolation purposes. First silicon nitride stop layer 3, and silicon oxide layer 2, are removed using either dry or wet etching procedures. The wet etching option is performed using a hot phosphoric acid solution for silicon nitride stop layer 3, and using a buffered hydrofluoric acid solution for silicon oxide layer 2. The removal rate of HDP silicon oxide layer 7, and of silicon oxide layer 2, are identical in the buffered hydrofluoric acid solution, thus the final height of the HDP silicon oxide in the STI regions is only higher than the top surface of semiconductor substrate 1, by the thickness of silicon nitride layer 3. The dry etch option for removal of these layers consists of a RIE procedure using either $CF_4$ or $CHF_3$ as an etchant for both silicon nitride layer 3, and for silicon oxide layer 2. After formation of gate insulator 11, comprised of silicon dioxide, gate structure 12, comprised of either doped polysilicon, or a polycide (metal silicide-polysilicon), is created. Sidewall spacers 13, comprised of either silicon oxide or silicon nitride, are next formed on the sides of gate structure 12, via deposition of an insulator layer, followed by an anisotropic RIE procedure. Source/drain region 14, is then formed via ion implantation procedures, self-aligned to gate structure 12, and butting insulator filled, STI region 5.

A third embodiment of this invention is the use of a photolithographic and etching procedure, applied to the composite, (BPSG layer 8,—HDP silicon oxide layer 7), in regions which can are comprised with a thicker HDP silicon oxide layer 7. Region 15, depicting a region with a low density of STI regions, would be a region susceptible to the thicker HDP silicon oxide layer. Photoresist shape 16, is used as a mask to allow exposed regions of BPSG layer 8, and a portion of exposed regions of HDP silicon oxide layer 7, to be removed via dry etching, using $CHF_3$ of $CF_4$ as an etchant, or via a wet etch procedure, using a buffered hydrofluoric acid solution as an etchant. Photoresist shape 16, is then removed via plasma oxygen ashing and careful wet clean procedures, followed by the same CMP procedure, previously described in the first embodiment, resulting in the structure shown schematically in FIG. 4. The combination of the composite insulator layer featuring the planarizing, reflowed BPSG layer, and the thinning of the composite insulator layer in regions featuring a low density of STI shapes, results in the desired smooth top surface topography, after application of the STI defining, CMP procedure. In addition the use of the overlying layer of reflowed BPSG reduced the level of roughness of the surface of HDP silicon oxide layer, in the STI shapes, when compared to counterparts which were fabricated using only HDP silicon oxide.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating insulator filled, shallow trench isolation (STI), regions, in a semiconductor substrate, comprising the steps of:

forming a first insulator layer on said semiconductor substrate;

forming a second insulator layer on said first insulator layer;

forming STI shapes in said second insulator layer, in said first insulator layer, and in a top portion of said semiconductor substrate;

growing a silicon oxide layer on the exposed semiconductor surfaces in said STI shapes;

depositing a third insulator layer on the top surface of said second insulator layer, and completely filling said STI shapes;

depositing a fourth insulator layer on said third insulator layer;

performing an anneal procedure at a temperature between about 850 to 950° C., creating a reflowed fourth insulator layer, with a smooth top surface topography;

performing a chemical mechanical polishing (CMP), procedure, removing said reflowed fourth insulator layer, removing said third insulator layer from the top surface of said second insulator layer, and removing a top portion of said third insulator layer in a region overlying said STI shapes, with a bottom portion of said third insulator layer creating said STI regions, in said STI shapes; and removing said second insulator layer, and said first insulator layer, resulting in said STI regions in said top portion of said semiconductor substrate.

2. The method of claim 1, wherein said first insulator layer is a silicon oxide layer, obtained via either LPCVD, PECVD, or thermal oxidation procedures, at a thickness between about 43 to 53 Angstroms.

3. The method of claim 1, wherein said second insulator layer is a silicon nitride layer, obtained via LPCVD or PECVD procedures at a thickness between about 2050 to 2350 Angstroms.

4. The method of claim 1, wherein the depth of said STI shapes, in said top portion of said semiconductor substrate, is between about 2000 to 3000 Angstroms.

5. The method of claim 1, wherein said STI shapes are comprised of narrow trenches, between about 0.245 to 1.3 um, in width, and comprised of wide trenches, greater than 1.3 um, in width.

6. The method of claim 1, wherein said third insulator layer is a silicon oxide layer, obtained at a thickness between about 4500 to 5100 Angstroms, using a high density plasma deposition procedure, using TEOS as a source.

7. The method of claim 1, wherein said fourth insulator layer is a boro-phosphosilicate layer, obtained via LPCVD or PECVD procedures, to a thickness between about 5000 to 6000 Angstroms, comprised with $B_2O_3$ at a weight percent between about 3 to 4.5%, and comprised with $P_2O_5$ at a weight percent between about 3 to 5.5%.

8. The method of claim 1, wherein said anneal procedure, performed at a temperature between about 850 to 950° C., is performed for a time between about 30 to 90 min.

9. The method of claim 1, wherein said second insulator layer and said first insulator layer, are removed via wet etch procedures, using hot phosphoric acid as an etchant for said second insulator layer, and using buffered hydrofluoric acid as an etchant for said first insulator layer.

10. The method of claim 1, wherein said second insulator and said first insulator layer, are removed via dry etch procedures, using $CF_4$ or $CHF_3$ as an etchant for said second insulator layer, and for said first insulator layer.

11. A method of fabricating silicon oxide filled, STI regions in a semiconductor substrate, featuring a disposable, reflowed, boro-phosphosilicate glass (BPSG), layer, overlying a silicon oxide layer, with said BPSG layer used to optimize the planarization of said silicon oxide filled, STI regions, comprising the steps of:

depositing a silicon oxide layer on said semiconductor substrate;

depositing a silicon nitride layer;

forming STI shapes, of a first width, and STI shapes, of a second width, in said silicon nitride layer, in said first silicon oxide layer, and in a top portion of said semiconductor substrate;

thermally growing a silicon oxide liner layer on the exposed surfaces of said semiconductor substrate, in said STI shapes;

depositing a high density plasma (HDP), silicon oxide layer on said silicon nitride layer, and completely filling said STI shapes, of said first width, and of said second width;

depositing said BPSG layer on said HDP silicon oxide layer;

performing an anneal procedure at a temperature between about 850 to 950° C., for a time between about 30 to 90 min. to reflow said BPSG layer;

performing a CMP procedure to completely remove said reflowed BPSG layer, and to remove portions of said HDP silicon oxide layer from the top surface of said silicon nitride layer, resulting in said silicon oxide filled, STI regions, in said STI shapes of said first width, and in said STI shapes of said second width, with the top surface of all silicon oxide filled, STI regions planar with the top surface of said silicon nitride layer; and removing said silicon nitride layer and said silicon oxide layer from the top surface of said semiconductor substrate.

12. The method of claim 11, wherein said silicon oxide layer is obtained via either LPCVD, PECVD, or thermal oxidation procedures, at a thickness between about 43 to 53 Angstroms.

13. The method of claim 11, wherein said silicon nitride layer is obtained via LPCVD or PECVD procedures at a thickness between about 2050 to 2350 Angstroms.

14. The method of claim 11, wherein said STI shapes of a first width are comprised of narrow trenches, with a width between about 0.245 to 1.3 um.

15. The method of claim 11, wherein said STI shapes of a wide width are comprised with wide trenches, with a width greater than 1.3 um.

16. The method of claim 11, wherein the depth of said STI shapes of said first width, and of said second width, located in said top portion of said semiconductor substrate, is between about 2000 to 3006 Angstroms.

17. The method of claim 11, wherein said silicon oxide liner located on the exposed surfaces of said semiconductor substrate, in said STI shapes, is obtained via thermal oxidation procedures, to a thickness between about 100 to 140 Angstroms.

18. The method of claim 11, wherein said HDP silicon oxide layer is obtained at a thickness between about 4500 to 5100 Angstroms, using a high density plasma deposition procedure, using TEOS as a source.

19. The method of claim 11, wherein said borophosphosilicate layer is obtained via LPCVD or PECVD procedures, to a thickness between about 5000 to 6000 Angstroms, comprised with $B_2O_3$ at a weight percent between about 3 to 4.5%, and comprised with $P_2O_5$ at a weight percent between about 3 to 5.5%.

20. The method of claim 11, wherein said silicon nitride layer and said silicon oxide layer are removed via wet etch procedures, using hot phosphoric acid as an etchant for said silicon nitride layer, and using buffered hydrofluoric acid as an etchant for said silicon oxide layer.

21. The method of claim 11, wherein said silicon nitride layer and said silicon oxide layer, are removed via dry etch procedures, using $CF_4$ or $CHF_3$ as an etchant for both said silicon nitride layer, and said silicon oxide layer.

22. A method of fabricating silicon oxide filled, STI regions in a semiconductor substrate, featuring a planarization procedure applied to a disposable, reflowed borophosphosilicate glass (BPSG), layer, overlying a silicon oxide layer, located in a first region of said semiconductor substrate wherein said first region is comprised with a high density of shallow trench shapes, and with said planarization procedure applied to a bottom portion of said silicon oxide layer located in a second region of said semiconductor substrate wherein said second region is comprised with a low density of shallow trench shapes, comprising the steps of:

depositing a silicon oxide layer on said semiconductor substrate;

depositing a silicon nitride layer;

forming STI shapes of a first width, and forming STI shapes of a second width, in said silicon nitride layer, in said first silicon oxide layer, and in a top portion of said semiconductor substrate located in said first region of said semiconductor, with a second region of said semiconductor substrate comprised without shallow trench shapes;

thermally growing a silicon oxide liner layer on the exposed surfaces of said semiconductor substrate, in said STI shapes;

depositing a high density plasma (HDP), silicon oxide layer on said silicon nitride layer, and completely filling said STI shapes, of said first width, and of said second width;

depositing said BPSG layer on said HDP silicon oxide layer;

performing an anneal procedure to reflow said BPSG layer;

removing said reflowed BPSG layer, and a top portion of said HDP silicon oxide layer in said second region of said semiconductor substrate, leaving said reflowed BPSG layer, and said HDP silicon oxide layer in said first region of said semiconductor substrate;

performing a CMP procedure to completely remove said reflowed BPSG layer and said HDP silicon oxide layer from the top surface of said silicon nitride layer in said first region of said semiconductor substrate, and removing a bottom portion of said HDP silicon oxide from the top surface of said silicon nitride layer in said second region of said semiconductor substrate, resulting in said silicon oxide filled, STI regions, in said STI shapes of said first width and in said STI shapes of said second width, in said first region of said semiconductor substrate, with the top surface of all silicon oxide filled, STI regions planar with the top surface of said silicon nitride layer; and removing said silicon nitride layer and said silicon oxide layer from the top surface of said semiconductor substrate.

23. The method of claim 22, wherein said reflowed BPSG layer, and said HDP silicon oxide layer, located in said first region of said semiconductor substrate region, is protected by a photoresist shape during an etching procedure used to remove said reflowed BPSG layer, and a top portion of said HDP silicon oxide layer.

24. The method of claim 22, wherein removal of said reflowed BPSG layer, and of a top portion of said HDP silicon oxide layer is accomplished via dry etching using $CHF_3$ or $CF_4$ as an etchant.

25. The method of claim 22, wherein removal of said reflowed BPSG layer, and of a top portion of said HDP silicon oxide layer is accomplished via a wet etch procedure using a buffered hydrofluoric acid solution as an etchant.

* * * * *